(12) United States Patent
Choi

(10) Patent No.: US 6,324,115 B1
(45) Date of Patent: Nov. 27, 2001

(54) SEMICONDUCTOR MEMORY DEVICE WITH BURST MODE ACCESS

(75) Inventor: Byeng-Sun Choi, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/520,730

(22) Filed: Mar. 8, 2000

(30) Foreign Application Priority Data

Mar. 11, 1999 (KR) .................................................. 99-08143

(51) Int. Cl.[7] ...................................................... G11C 8/00
(52) U.S. Cl. ................... 365/230.03; 365/233; 365/236; 365/189.05
(58) Field of Search ............................... 365/230.03, 233, 365/236, 230.06, 230.08, 189.04, 189.05

(56) References Cited

U.S. PATENT DOCUMENTS

| | | | |
|---|---|---|---|
| 5,457,650 | 10/1995 | Sugiura et al. ....................... | 365/184 |
| 5,559,990 | 9/1996 | Cheng et al. ........................ | 395/484 |
| 5,768,188 | 6/1998 | Park et al. ...................... | 365/185.03 |
| 6,031,785 | * 2/2000 | Park et al. ........................... | 365/203 |
| 6,134,178 | * 10/2000 | Yamazaki et al. ................... | 365/233 |

* cited by examiner

*Primary Examiner*—David Helms
*Assistant Examiner*—David Lam
(74) *Attorney, Agent, or Firm*—Marger Johnson & McCollom, P.C.

(57) ABSTRACT

A data sensing control circuit according to the present invention is provided in a semiconductor memory device with a burst access mode. The data sensing control circuit generates sensing control signals for data sensing operation by use of a transition information of an address bit signal synchronized with a read enable clock signal and used for a bank selection. According to such a data sensing control scheme, no sensing of each sensing period is performed when the read enable clock signal transitions. Therefore, a power noise (or input/output noise) issued at data-out does not affect the data sensing operation of the semiconductor memory device having the burst access mode.

13 Claims, 8 Drawing Sheets

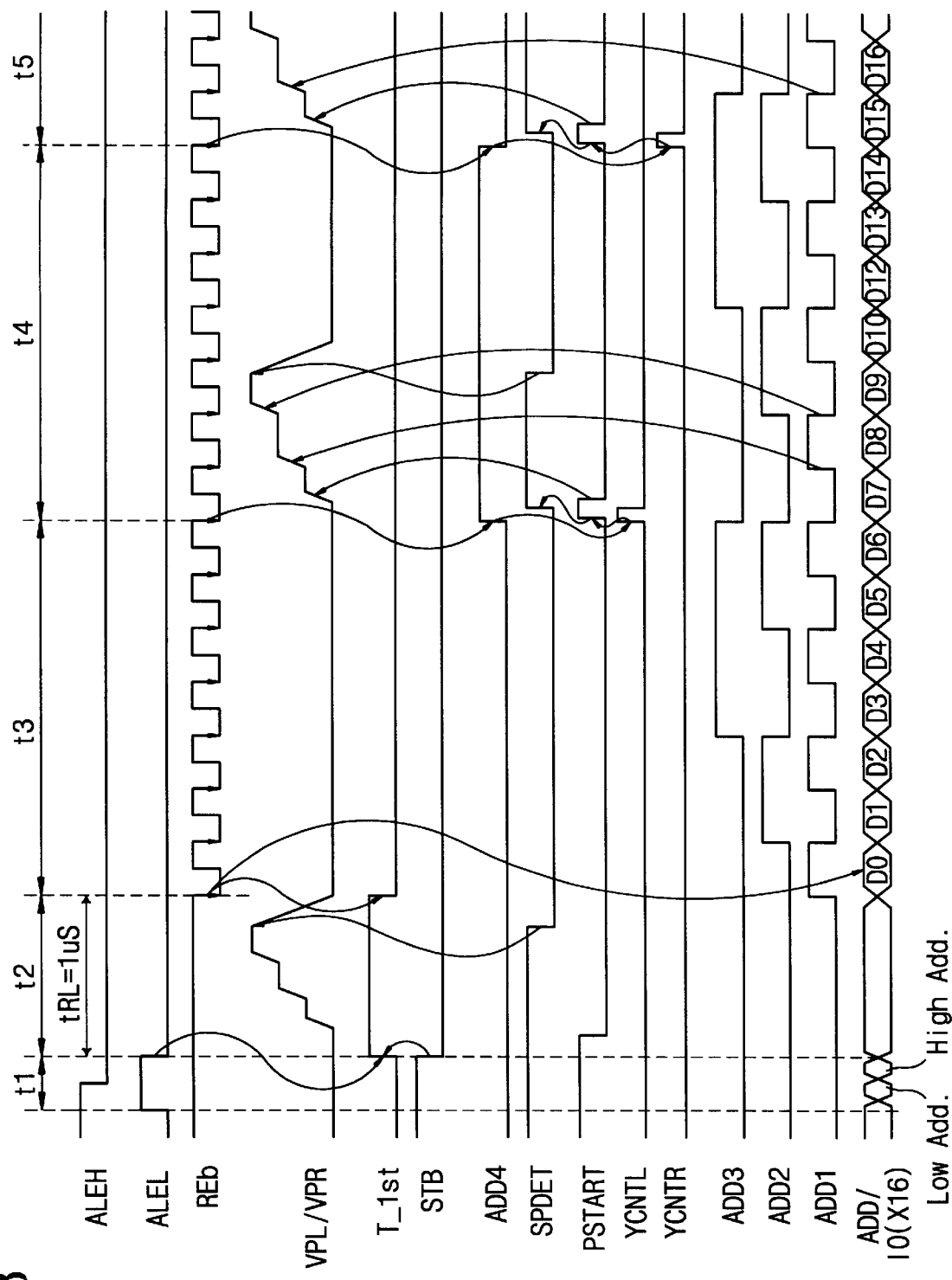

SEMICONDUCTOR MEMORY DEVICE WITH BURST MODE ACCESS

FIELD OF THE INVENTION

The present invention relates to semiconductor memory devices and, more particularly, to a semiconductor memory device having a burst mode access.

BACKGROUND OF THE INVENTION

In order to improve the access speed of a memory device, a burst mode access function can be provided for the memory device. A burst mode access read of the memory device can start at any memory location and can continue for any number of memory locations. In such a memory, any number of memory locations, not only groups of four memory locations, can be read consecutively in burst mode. Sequential memory access is consequently quite fast.

In an example, the burst mode access is provided as follows. The memory array is divided into two memory banks. Each memory bank includes half of the columns of the memory array. Each memory bank has its own row and column decoders that can access the corresponding memory bank independent of the other side. The columns of each memory bank are divided into predetermined groups of columns. A sense amplifier circuit is provided for each group in each memory banks.

In accordance with burst mode access, data in the memory banks is sensed through the corresponding sense amplifier circuits simultaneously. Data thus sensed from both memory banks is held in data registers. First, data from the data register corresponding to one memory bank is transferred to the exterior. Then, data from the data register corresponding to the other memory bank is transferred to the exterior, and, at the same time, data is sensed from the next location in the first memory bank, through its attached sense amplifier circuit.

An example of a memory device with an above-mentioned burst mode access is disclosed in U.S. Pat. No. 5,559,990, entitled MEMORIES WITH BURST MODE ACCESS, which is incorporated by reference herein.

It is well known in the art that power noise (often referred to as "input/output (IO) noise") accompanies data output signaling. If data in one memory bank is sensed at the same time that data corresponding to another memory bank is being output, the data sensing operation may be affected by power noise. As a result, it is impossible to ensure a stable data sensing operation for a memory device during burst mode access.

SUMMARY OF THE INVENTION

It is therefore an object of the present invention to provide a burst mode semiconductor memory device having immunity against power noise-induced sensing errors.

It is another object of the invention to provide a burst mode semiconductor memory device capable of ensuring stable data sensing operations.

In order to attain the above objects, according to one aspect of the present invention, a semiconductor memory device with a burst access mode is provided. The memory device comprises a memory array, a counter circuit, a data sensing-control circuit, and a data-reading circuit. The memory array comprises first and second memory banks, each comprising a plurality of memory cells for storing multi-level data. The first and second memory banks are read independently from each other. The counter circuit receives externally applied address bit signals to count up the address bit signals in synchronization with a read enable clock signal. And, the data-sensing control circuit receives one of the address bit signals counted up by the counter circuit and generates a set of data-sensing control signals when the one address bit signal transitions. The one address bit signal is used for bank selection. The data-reading circuit operates responsive to the data-sensing control signals, and senses multi-level data from the first and second memory banks alternately.

According to the device, the data reading circuit holds the multi-level data sensed from one of the memory banks and, at the same time, senses multi-level data from the other of the memory banks during a data sensing operation. And, during the data sensing operation for the other memory bank, the multi-level data held in the data reading circuit is output sequentially to the exterior in synchronization with the read enable clock signal and in accordance with the combination of the others of the address bit signals thus counted up.

According to the device, the data sensing control circuit comprises an address transition detecting section for generating a first address transition detection signal in a pulse form when the one address bit signal transitions from a first logic level to a second logic level, and for generating a second address transition detection signal in a pulse form when the one address bit signal transitions from the second logic level to the first logic level; a sensing start signal generating section for generating a sensing start signal in a pulse form in response to the first address transition detection signal, the second address transition detection signal or a chip activation signal; a clock generating section for generating a plurality of clock signals in response to a clock control signal, wherein the clock signals of the plurality each have a different period; a sensing control signal generator for generating the sensing control signals in response to the clock signals during the data sensing operation; a sensing period detector for activating a sensing period detection signal indicating the period of the data sensing operation in response to the sensing start signal, wherein the sensing period detector receives the clock signals, detects whether the data sensing operation is ended, and inactivates the sensing period detection signal in accordance with the detection result; and a clock controller responsive to the sensing start signal, for activating the clock control signal during the activation of the sensing period detection signal so as to generate the clock signals, wherein the clock controller inactivates the clock generating section at the inactivation of the sensing period detection signal.

According to the semiconductor memory device of the present invention, a bit line precharge operation of each sensing period starts in synchronization with the read enable clock signal. Since no sensing of each sensing period is performed at a transition timing of the read enable clock signal, this burst access mode semiconductor memory device has immunity against power noise, resulting in a stable data sensing operation.

BRIEF DESCRIPTION OF THE DRAWINGS

A more complete appreciation of the present invention, and many of the attendant advantages thereof, will become readily apparent as the same becomes better understood by reference to the following detailed description, when considered in conjunction with the accompanying drawings in which like reference symbols indicate the same or similar components, wherein:

FIG. 8 a timing diagram for describing a burst mode access operation according to a second embodiment of the present invention.

DESCRIPTION OF THE PREFERRED EMBODIMENT

Preferred embodiments according to the present invention will be described below with reference to the accompanying drawings.

Figure 1:
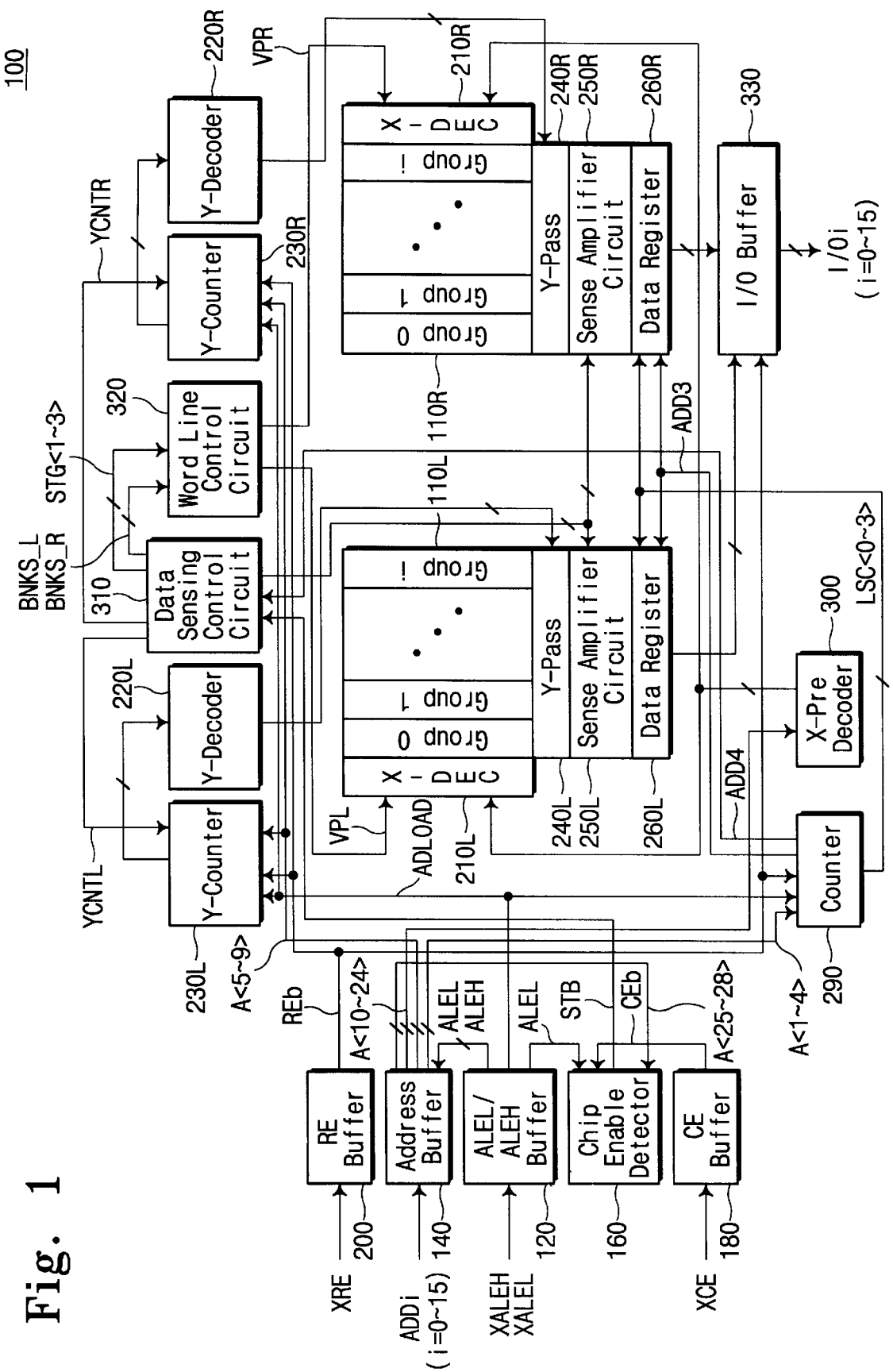
FIG. 1 is a block diagram of a semiconductor memory device according to the present invention.

FIG. 1 is a block diagram of a semiconductor memory device 100 according to the present invention. The semiconductor memory device 100 has a burst mode access so as to allow reading in burst mode any number of memory cells starting at any address. A memory array 110 of the device 100 is divided into two memory banks, that is, a left memory bank 110L and a right memory bank 110R. The left memory bank 110L is divided into a plurality of groups each corresponding to input/output pins (not shown) provided in the memory device 100. Similarly, the right memory bank 110R is divided into a plurality of groups each corresponding to the input/output pins.

Figure 2:
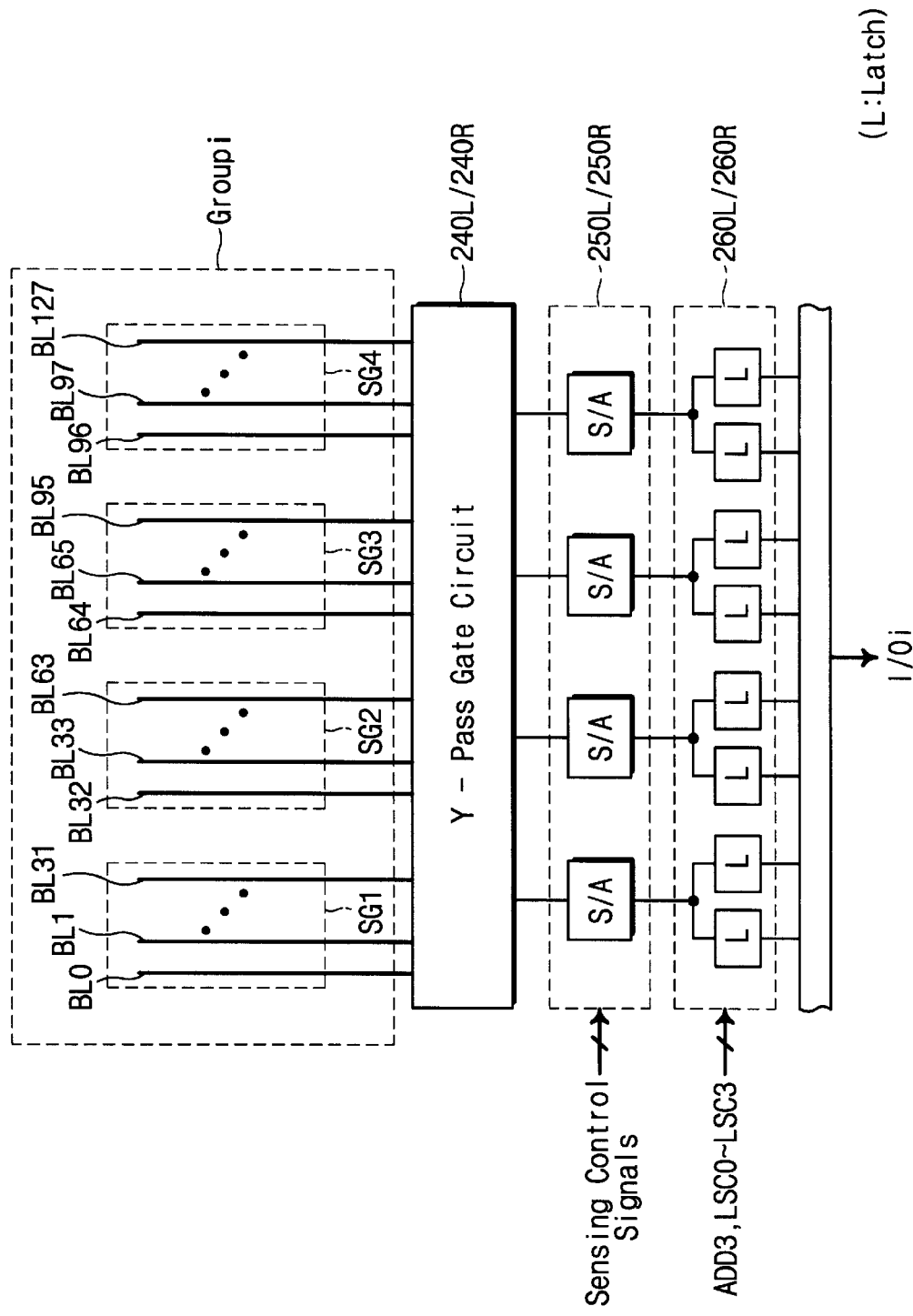
FIG. 2 is a block diagram showing the relationship between one group of bit lines and a sense amplifier circuit and between the sense amplifier circuit and a data register.

Referring to FIG. 2, for example, assume that 2048 bit lines (2K bit lines) in each memory bank 110L and 110R are provided, and that the device 100 has 16 input/output pins. Thus, each memory bank 110L and 110R is divided into 16 groups, each having 32 bit lines as illustrated in FIG. 2.

Although not shown in FIG. 1, the respective memory banks 110L and 110R have a plurality of memory cells arranged in a matrix form of plural bit lines and plural word lines, and each memory cell can store multi-level data, for example, 2 bits of data. Examples of the multi-level memory device are disclosed in U.S. Pat. No. 5,457,650, entitled APPARATUS AND METHOD FOR READING MULTI-LEVEL DATA STORED IN A SEMICONDUCTOR MEMORY, and U.S. Pat. No. 5,768,188, entitled MULTI-STATE NON-VOLATILE SEMICONDUCTOR MEMORY AND METHOD FOR DRIVING THE SAME, which are incorporated by reference herein.

Continuing to refer to FIG. 1, a buffer circuit 120 (hereinafter, referred to as "an ALEL/ALEH buffer") receives externally provided control signals XALEH and XALEL, and then generates low and high address latch enable signals ALEL and ALEH. Further, the ALEL/ALEH buffer 120 generates an address load signal ADLOAD when the low address latch enable signal ALEL transitions from a logic high level to a logic low level. An address buffer circuit 140 receives low and high address bit signals from the exterior in response to the low and high address latch enable signals ALEL and ALEH. It outputs first to fourth address bit signals. For example, when the signals ALEL and ALEH are high, the low address bit signals are latched into the address buffer circuit 140, and when the signal ALEH is low and the signal ALEL is high, the high address bit signals are latched into the address buffer circuit 140.

In this embodiment, the first address bit signals correspond to A1 to A4, the second address bit signals to A5 to A9, the third address bit signals to A10 to A24, and the fourth address bit signals to A25 to A28.

The semiconductor memory device 100 further comprises a chip enable detector 160 which generates a chip activation signal STB in response to a signal CEb from a CE buffer 180, the low address latch enable signal ALEL and the fourth address bit signals A25 to A28. A buffer circuit 200 (hereinafter, referred to as "an RE buffer") buffers externally provided read enable signal RE, producing REb, which is used as a clock signal in the semiconductor memory device 100 and as a synchronization signal between the device 100 and the exterior.

The memory banks 110L and 110R can be read independently from each other. For this, each memory bank has its own X- and Y-decoders, Y-counter, Y-pass gate circuit, sense amplifier circuit and data register. The left memory bank 110L has X-decoder 210L, Y-decoder 220L, Y-counter 230L, Y-pass gate circuit 240L, a sense amplifier circuit 250L, and a data register 260L. The right memory bank 110R has X-decoder 210R, Y-decoder 220R, Y-counter 230R, Y-pass gate circuit 240R, a sense amplifier circuit 250R, and a data register 260R.

In this embodiment, the Y-decoders 220L and 220R, Y-counters 230L and 230R, Y-pass gate circuits 240L and 240R, sense amplifier circuits 250L and 250R, and data registers 260L and 260R correspond to "a data reading circuit".

In FIG. 1, when the address load signal ADLOAD is pulsed (when the low address latch enable signal ALEL transitions from high to low), a counter 290 receives the first address bit signals A1 to A4, and the Y-counters 230L and 230R receive the second address bit signals A5 to A9. The counter 290 increments, starting from an address corresponding to the first address bit signals A1 to A4 in response to the read enable signal (or read enable clock signal) REb from the RE buffer 200 during the burst mode access. The Y-counter 230L increments the address bit signals held therein in synchronization with the read enable signal REb whenever a signal YCNTL from a data sensing control circuit 310 is pulsed. Similarly, the Y-counter 230R increments the address bit signals held therein in synchronization with the read enable signal REb whenever a signal YCNTR from the data sensing control circuit 310 is pulsed.

As shown in FIG. 1, the semiconductor memory device 100 further comprises a word line control circuit 320, which generates word line voltages VPL and VPR in response to signals BNKS_L, BNKS_R, and STGi (i=1, 2, and 3) from the data sensing control circuit 310. Each of the word line voltages VPL and VPR steps through a sequence of different voltage levels during a data sensing operation, as is disclosed in the aforementioned references.

In a case, for example, where a memory cell stores two bit of data (e.g., one of the values "00", "01", "10" and "11"), the data sensing operation, which comprises first, second and third sensing periods, is completed by applying a different word line voltage level to a selected word line during each sensing period. Each sensing period is comprised of a set of bit line precharge, sensing and bit line discharge operations.

When the left memory bank 110L is selected, one of the word lines thereof is chosen through X-decoder 210L X-pre decoder 300. And, the X-decoder 210L drives the selected word line with the word line voltage VPL. Similarly, when the right memory bank 110R is selected, one of the word lines thereof is chosen through X-decoder 210R and X-pre decoder 300. And, X-decoder 210R drives the selected word line with the word line voltage VPR.

Referring to FIG. 2 again, each group i of each memory bank 110L and 110R has 128 bit lines, which are divided into 4 subgroups SG1 to SG4 of 32 bit lines each. The corresponding Y-pass gate circuit selects one of the 32 bit lines of each subgroup SG1 to SG4 in response to outputs (decoded column select signals) from the corresponding Y-decoder. Four sense amplifiers corresponding to one group sense multi-level data (2-bit data) in selected memory cells in response to sensing control signals from the data sensing control circuit 310. The corresponding data register is configured such that 2 data latches are connected to each sense amplifier, so that 2-bit data sensed by one sense amplifier is latched into its corresponding two data latches. The content (1-bit data) in each latch is output in accordance with a combination of signals ADD3 and LSC0-3, unique to that latch, from the counter 290.

For example, when the signal ADD3 is low, the left data latch of each pair of data latches is selected. As the signals LSC0 to LSC3 are activated sequentially, the contents of each left data latch is sequentially transferred in synchronization with the read enable signal Reb to the exterior through an input/output buffer 330 of FIG. 1. Similarly, when the signal ADD3 is high, the right data latch of each pair of data latches is selected. As the signals LSC0 to LSC3 are activated sequentially, the contents of each right data latch is sequentially transferred in synchronization with the read enable signal REb to the exterior through the input/output buffer 330.

The signals LSC0 to LSC3 are signals obtained by decoding address bit signals ADD1 and ADD2 within counter 290. The burst mode access scheme can be used in any type of memory including any kind of ROM or RAM.

Figure 3:
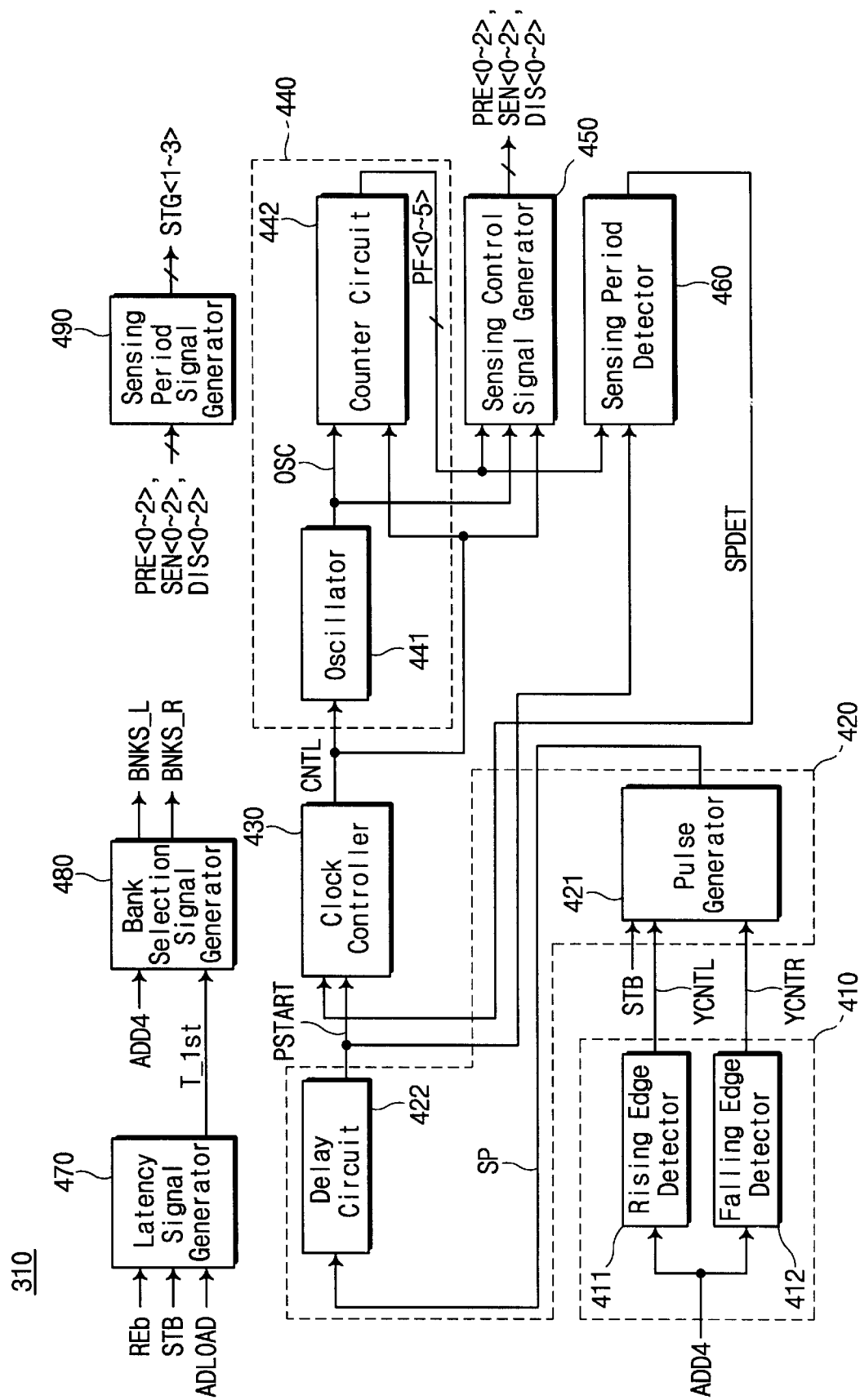
FIG. 3 is a block diagram showing a data sensing control circuit of FIG. 2 according to a first preferred embodiment of the present invention.

A block diagram of data sensing control circuit 310, according to a first preferred embodiment of the present invention, is illustrated in FIG. 3. As shown in FIG. 3, the data sensing control circuit 310 comprises an address transition detecting section 410, a sensing start signal generating section 420, a clock controller 430, a clock generating section 440, a sensing control signal generator 450, a sensing period detector 460, and a sensing period signal generator 490.

The address transition detecting section 410 receives an address bit signal ADD4 from counter 290. Detection section 410 uses ADD4 for bank selection, generating either a first or a second address transition detection signal (YCNTL or YCNTR) each time the signal ADD4 transitions. It should be seen, as illustrated in FIG. 1, that the address bit signal ADD4 is generated from the counter 290 in synchronization with the read enable signal REb. The detecting section 410 is comprised of a rising edge detector 411 and a falling edge detector 412. The rising edge detector 411 receives the address bit signal ADD4, and then generates the first address transition detection signal YCNTL in a pulse form when ADD4 transitions from a logic low level to a logic high level. The falling edge detector 412 receives the address bit signal ADD4, and then generates the second address transition detection signal YCNTR in a pulse form when ADD4 transitions from a logic high level to a logic low level.

When the first address transition detection signal YCNTL is pulsed (e.g., when the left memory bank 110L is selected), the Y-counter 230L performs a count-up operation. And, when the second address transition detection signal YCNTR is pulsed (e.g., when the right memory bank 110R is selected), the Y-counter 230R performs a count-up operation.

Still referring to FIG. 3, the sensing start signal generating section 420 generates a sensing start signal PSTART in response to the chip activation signal STB and the first and second address transition detection signals YCNTL and YCNTR. The sensing start signal generating section 420 is comprised of a pulse generator 421 and a delay circuit 422. The pulse generator 421 generates a pulse signal SP of a logic high level when the chip activation signal STB transitions from a logic high level to a logic low level or when one of the first and second address transition detection signals YCNTL and YCNTR is pulsed. The delay circuit 422 delays the pulse signal SP for a predetermined time period, for example, 100 ns. This delay allows for a Y-counter setting time (corresponding to a selected memory bank), a level setting time for various circuits associated with sensing, etc.

Clock controller 430 generates a clock control signal CNTL in response to the sensing start signal PSTART and a sensing period detection signal SPDET from the sensing period detector 460. The clock controller 430 activates the clock control signal CNTL at a logic high level during the activation of the signal SPDET and after the sensing start signal PSTART transitions from a logic high level to a logic low level.

The clock generating section 440 is comprised of an oscillator 441 and a counter circuit 442, and generates a plurality of clock signals PFi in response to the clock control signal CNTL. The oscillator 441 is comprised of a ring oscillator well known in the art and generates an oscillation signal OSC of a rectangular wave form in response to the clock control signal CNTL. The counter circuit 442 generates the clock signals PFi in response to the oscillation signal OSC. In this example, the clock signals comprise first to third clock signals PF0 to PF2. The first clock signal PF0 has half the period of the second clock signal PF1, which has half the period of the third clock signal PF2. The counter circuit 442 is reset by the clock control signal CNTL.

The sensing control signal generator 450 receives the clock signals PFi (i=0–2) from the clock generating section 440, and generates the sensing control signals PRE<0–2>, SEN<0–2> and DIS<0–2> synchronized with the oscillation signal OSC in response thereto. The sensing period signal generator 490 generates first to third sensing period signals STG1 to STG3 in response to the sensing control signals PRE<0–2>, SEN<0–2> and DIS<0–2>. The first sensing period signal STG1 corresponds to the first sensing period of the data sensing operation, the second sensing period signal STG3 to the second sensing period thereof, and the third sensing period signal STG3 to the third sensing period thereof.

In this embodiment, the signals PRE<0–2> define the bit line precharge time of each sensing period. That is, the signal PRE0 is activated during a first sensing period, the signal PRE1 during a second sensing period, and the signal PRE2 during a third sensing period. The signals SEN<0–2> define the data sensing time of each sensing period. That is, the signal SEN0 is activated during the first sensing period, the signal SEN1 during the second sensing period, and the signal SEN2 during the third sensing period. And, the signals DIS<0–2> define the bit line discharge time of each sensing period. That is, the signal DIS0 is activated during the first sensing period, the signal DIS1 during the second sensing period, and the signal DIS2 during the third sensing period.

The sensing period detector 460 takes the sensing period detection signal SPDET high during the period of a data sensing operation. SPDET is taken high in response to the sensing start signal PSTART. The detector 460 receives the clock signals PFi, detects when the data sensing operation has ended, and inactivates the sensing period detection signal SPDET when the data sensing operation is completed.

In operation, when the signal STB becomes low, the sensing start signal generating section 420 generates the sensing start signal PSTART. This makes the sensing period detector 460 activate the sensing period detection signal SPDET. The clock controller 430 generates the clock control signal CNTL when the sensing start signal PSTART transitions from high to low, so that the clock generating section 440 generates the clock signals PFi.

As the sensing control signal generator 450 produces the sensing control signals in response to the clock signals PFi, a sense amplifier circuit 250L/250R of FIG. 1 starts performing a data sensing operation. The sensing period detector 460 detects when the data sensing operation has completed, and inactivates the sensing period detection signal SPDET. When the signal SPDET is inactivated, the clock control signal CNTL from the clock controller 430 becomes low. As a result, it stops the clock generating section 440 from generating the clock signals. That is, the data sensing operation has been completed.

If the first or second address transition detection signal YCNTL or YCNTR is pulsed, the sensing start signal PSTART is pulsed. This produces another circuit response as described above.

As shown in FIG. 3, the data sensing control circuit 310 further comprises a latency signal generator 470 and a bank selection signal generator 480. The latency signal generator 470 generates a latency signal T_1st in response to the read enable signal REb, the chip activation signal STB and the address load signal ADLOAD. The latency signal T_1st signals that both of the memory banks are to be read simultaneously, as will be described in detail below. When the signal STB transitions from high to low and the signal ADLOAD is pulsed, the latency signal generator 470 takes the latency signal T_1st high. When the read enable signal REb transitions from high to low, the latency signal generator 470 inactivates the latency signal T_1st.

The bank selection signal generator 480 responds to the address bit signal ADD4 and the latency signal T_1st to generate first and second bank selection signals BNKS_L and BNKS_R. When the latency signal T_1st is active, the bank selection signal generator 480 activates the first and second bank selection signals BNKS_L and BNKS_R, regardless of the address bit signal ADD4. This makes the word line control circuit 320 of FIG. 1 generate word line voltages VPL and VPR for the memory banks 110L and 110R. When the latency signal T_1st is inactive, the bank selection signal generator 480 activates one of the signals BNKS_L and BNKS_R according to the address bit signal ADD4.

For example, when the signal ADD4 used for bank selection transitions from low to high, the first bank selection signal BNKS_L is activated high, so that the word line control circuit 320 generates the word line voltage VPL for the left memory bank 110L. When the signal ADD4 transitions from high to low, the second bank selection signal BNKS_R is activated high, so that the word line control circuit 320 generates the word line voltage VPR for the right memory bank 110R.

After the first data sensing operation for both memory banks 110L and 110R, a subsequent data sensing operation for any memory bank starts after the address bit signal ADD4 transitions. But ADD4 is generated in synchronization with the read enable signal REb. Therefore, the power noise issued at the transition of the read enable signal REb does not affect the data sensing operation, resulting in a stable sensing operation.

Figure 4:
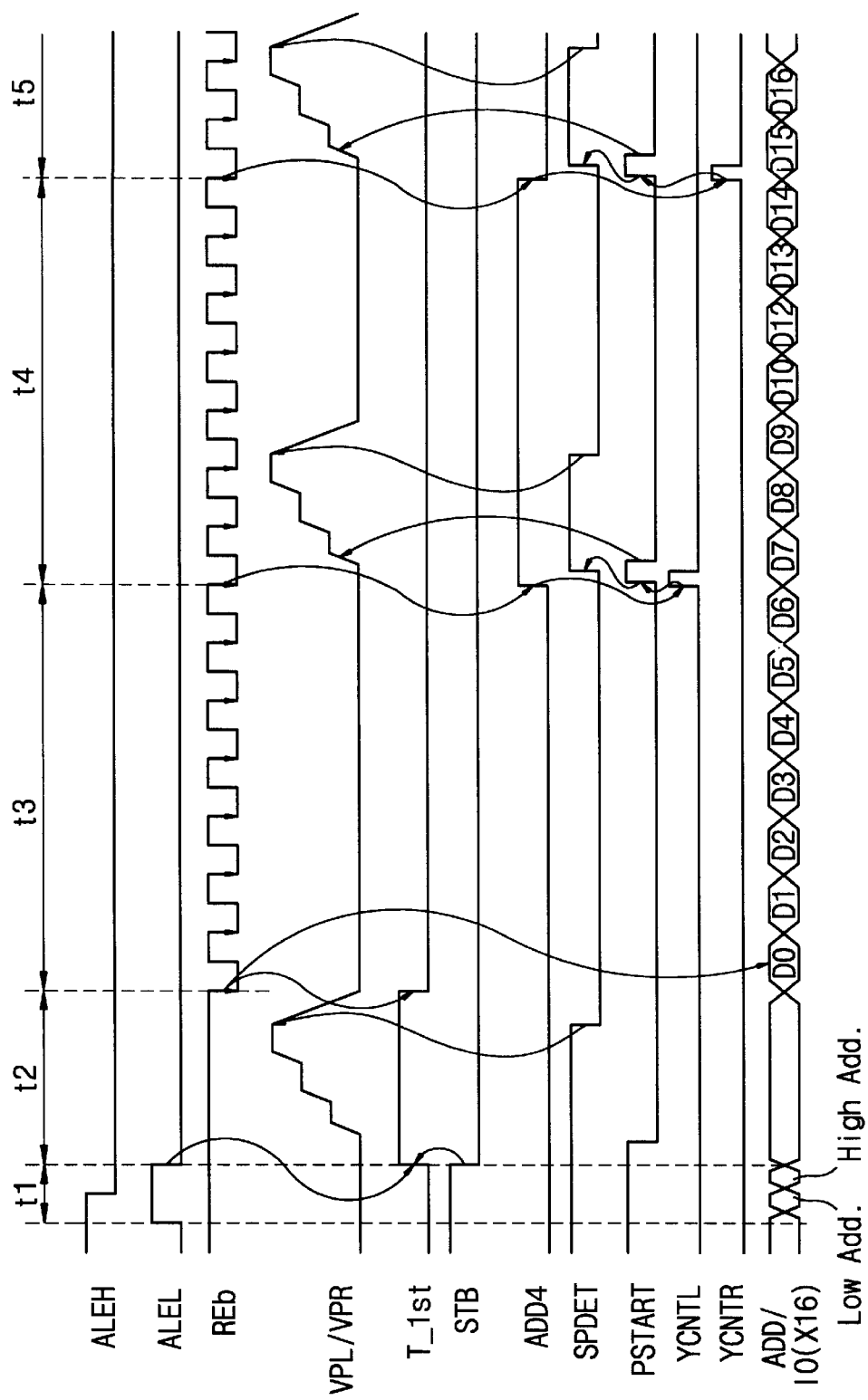
FIG. 4 is a timing diagram for describing a burst mode access operation according to the first embodiment of the present invention.

FIG. 4 is a timing diagram for a burst mode access operation according to the first embodiment. A burst mode access operation according to the first embodiment of the present invention will be described below with reference to the accompanying drawings. Assume that outputs from the address buffer circuit 140 are set low before external address input, that an address bit signal ADD4 of a logic low level is latched into the address buffer circuit 140, that when the signal ADD4 is low the left memory bank 110L is selected, and that when the signal ADD4 is high the right memory bank 110R is selected.

During first period t1, both the low and high address latch enable signals ALEL and ALEH become high, so that low address bit signals (or first addresses) are latched into the address buffer circuit 140. Then, when the high address latch enable signal ALEH transitions from high to low, high address bit signals (or second addresses) are latched into the address buffer circuit 140. When the low address latch enable signal ALEL also transitions from high to low, the address load signal ADLOAD is pulsed. This enables Y-counters 230L and 230R and counter 290 to latch corresponding address bit signals from the address buffer circuit 140. That is, Y-counters 230L and 230R receive the second address bit signals A5 to A9 in response to the address load signal ADLOAD, and counter 290 receives the first address bit signals A1 to A4 in response to ADLOAD.

During second period t2, the left and right memory banks 110L and 110R are read simultaneously as follows.

First, during the activation of the latency signal T_1st from the latency signal generator 470, the bank selection signal generator 480 activates first and second bank selection signals BNKS_L and BNKS_R regardless of the address bit signal ADD4 state (this means that memory banks 110L and 110R are selected simultaneously). The sensing start signal generating section 420 produces the sensing start signal PSTART when the chip activation signal STB transitions from high to low. At this time, the sensing period detector 460 activates the sensing period detection signal SPDET in response to the sensing start signal PSTART.

Clock controller 430 then generates the clock control signal CNTL (which is activated during the activation of the signal SPDET when the signal PSTART transitions from high to low). This makes the clock generating section 440 generate the clock signals PFi, so that the sensing control signal generator 450 outputs the sensing control signals PRE<0–2>, SEN<0–2> and DIS<0–2> sequentially in response to the clock signals PFi. The sensing period signal generator 490 produces the first, second and third sensing period signals STG1, STG2 and STG3 sequentially in accordance with the sensing control signals PRE<0–2>, SEN<0–2> and DIS<0–2>. As a result, the word line voltage control circuit 320 generates first and second word line voltages VPL and VPR in response to the signals STG1, STG2, STG3, BNKS_L and BNKS_R.

The word line voltages VPL and VPR are supplied to a row (word line) of the memory bank 110L and to the same row (word line) of the memory bank 110R. As the word line voltages VPL and VPR change over the first, second and third sensing periods, 8-bit data corresponding to each group of the memory banks 110L and 110R is latched into the data registers 260L and 260R through the Y-pass gate circuits 240L and 240R and the sense amplifier circuits 250L and 250R. The sensing period detector 460 inactivates the sensing period detection signal SPDET to a logic low level when the data sensing operation has ended. Then, the clock controller 430 inactivates the clock control signal CNTL to a logic low level in response to the sensing period detections signal SPDET, so that the clock generating section 440 is disabled. At this point, the first data sensing operation for the memory banks 110L and 110R has been completed.

During third period t3, under the control of the signals ADD3, LSC0, LSC1, LSC2 and LSC3, data held in the data register 260L is sequentially outputted to the exterior through the IO buffer circuit 330 in synchronization with the read enable signal REb. The left bank is output first because address bit signal ADD4, used for bank selection, is low. At the same time, data register 260R continues to hold data sensed during the period t2.

As illustrated in FIG. 4, when the address bit signal ADD4 transitions from low to high (meaning that the right memory bank 110R is selected), data in the data register 260R is sequentially transferred to the exterior through the IO buffer circuit 330 in synchronization with the read enable signal REb during period t4. At the same time, a data sensing operation for the left memory bank 110L is performed as follows.

When the address bit signal ADD4 transitions from low to high, the address transition detecting section 410 generates the first address transition detection signal YCNTL in a pulse form, the bank selection signal generator 480 activates the bank selection signal BNKS_L (the latency signal $T_{13}$ 1st is maintained low), and the Y-counter 230L performs its count-up operation. The sensing start signal generating section 420 generates the signal PSTART in response to the address transition detection signal YCNTL, so that the sensing period detection signal SPDET is activated high, again.

Clock controller 430 generates the clock control signal CNTL during the activation of the signal SPDET when the signal PSTART transitions from high to low. This makes the clock generating section 440 generate the clock signals PFi, so that the sensing control signal generator 450 outputs the sensing control signals PRE<0–2>, SEN<0–2> and DIS<0–2> sequentially in response to the clock signals PFi. The sensing period signal generator 490 produces the first, second and third sensing period signals STG1, STG2 and STG3 sequentially in response to the sensing control signals PRE<0–2>, SEN<0–2> and DIS<0–2>. As a result, the word line voltage control circuit 320 generates word line voltage VPL in response to the signals STG1, STG2, STG3 and BNKS_L.

The word line voltage VPL is supplied to the previous selected row (word line) of the memory bank 110L. As the word line voltage VPL changes over the first, second and third sensing periods, 8-bit data corresponding to each group of the memory bank 110L is latched into the data register 260L through the Y-pass gate circuit 240L and the sense amplifier circuit 250L. The sensing period detector 460 detects when the data sensing operation for the memory bank 110L has ended, and inactivates the sensing period detection signal SPDET at a logic low level. Then, the clock controller 430 inactivates the clock control signal CNTL at a logic low level, so that the clock generating section 440 is disabled. The data sensing operation for the memory bank 110L is completed during the data-out operation associated with the memory bank 110R. A burst mode access operation as set forth above continues to be performed repeatedly until the desired amount of data has been read out.

In accordance with the first preferred embodiment of the present invention, after the period t1 (the data sensing operation for the memory banks 110L and 110R is performed), a data sensing operation for one memory bank starts by use of transition information of the address bit signal ADD4. The signal ADD4 is used for bank selection and is generated in synchronization with the read enable signal REb (used as a clock signal). With such a data sensing control scheme, no sensing is performed when the read enable signal REb is transitioning from high to low. Therefore, the power noise (or IO noise) issued at data-out does not affect respective data sensing operations of each sensing period, so that the memory device 100 has an immunity against the power noise. As a result, the semiconductor memory device 100 of the present invention provides a stable data sensing operation, resulting in an improved reliability.

Figure 5:
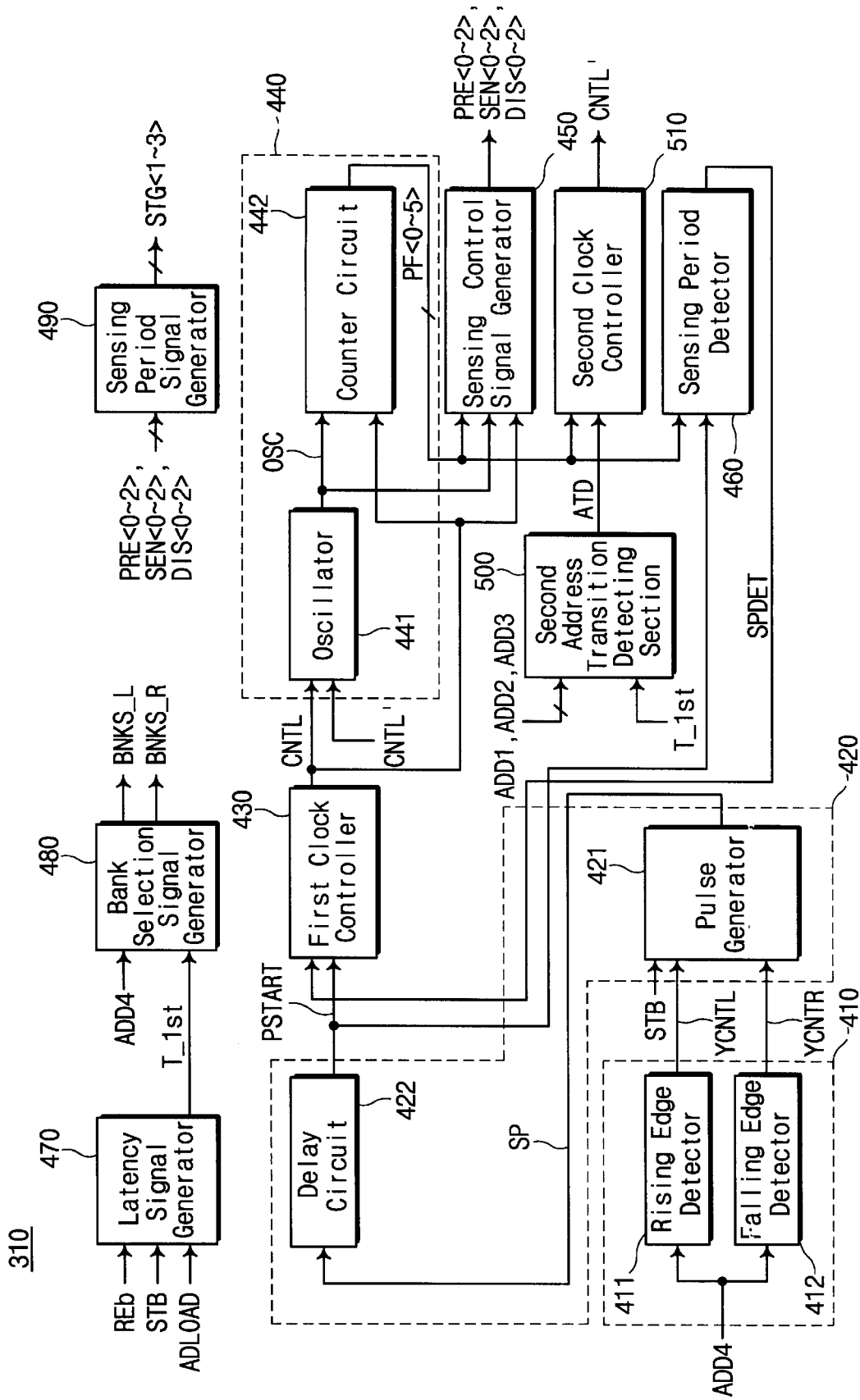
FIG. 5 is a block diagram showing a data sensing control circuit of FIG. 2 according to a second preferred embodiment of the present invention.

FIG. 5 is a block diagram of data sensing control circuit 310 according to a second preferred embodiment. The second embodiment differs from the first embodiment in that a second address transition detecting section 500 and a second clock controller 510 are added therein, and in that the oscillator 441 is controlled by the first and second clock controllers 430 and 510. In FIG. 5, the constituent elements that are identical to those in first embodiment of FIG. 3 are labeled with the same reference numerals.

Figure 6:
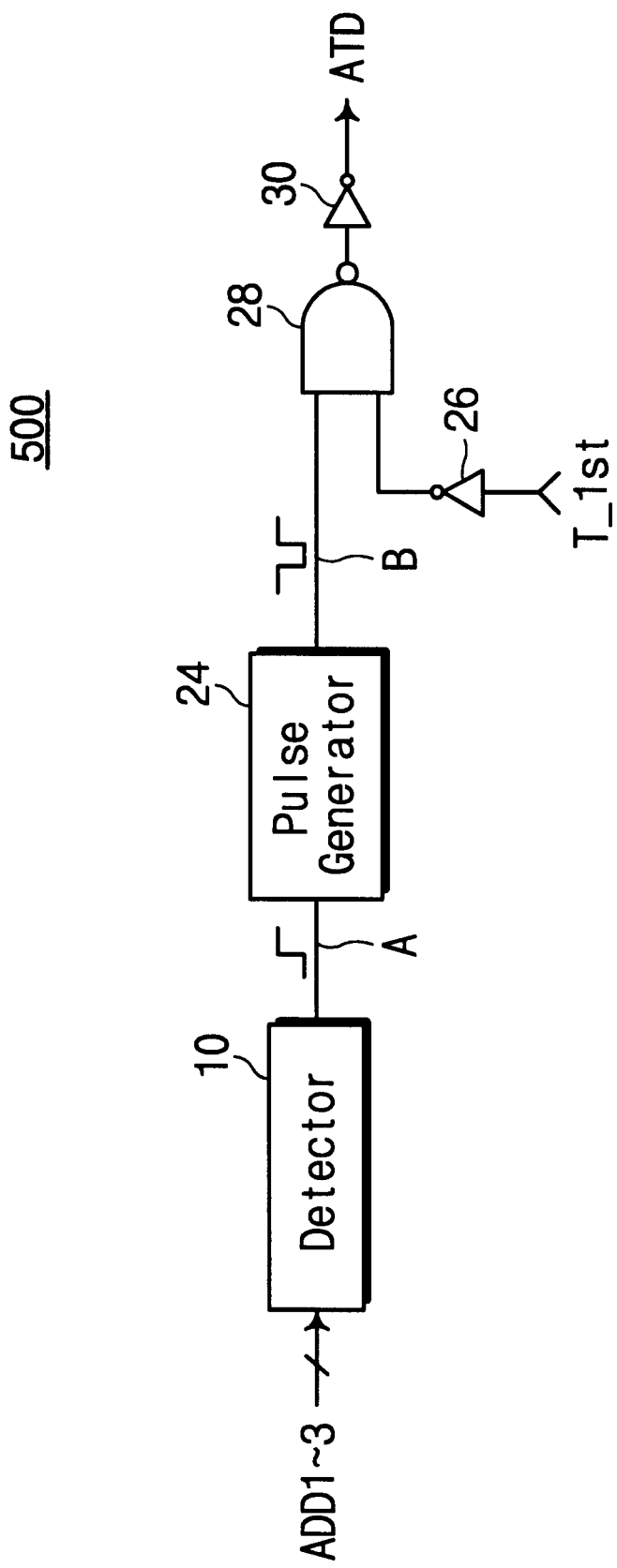
FIG. 6 is a preferred embodiment of a second address transition detecting section in FIG. 5.

The second address transition detecting section 500 uses address bit signals ADD1, ADD2 and ADD3 and the latency signal T_1st to generate a third address transition detection signal ATD in pulse form. The address bit signals ADD1 to ADD3 are supplied from the counter 290 (FIG. 1), which operates in response to the read enable signal REb. Referring to FIG. 6, which shows a circuit diagram of the second address transition detecting section 500 according to a preferred embodiment of the invention, a detector 10, a pulse generator 24, two inverters 26 and 30, and a NAND gate 28 constitute the second address transition detecting section 500.

According to the second address transition detecting section 500, the third address transition detection signal ATD has a logic low level regardless of the address bit signals ADD1 to ADD3 when the latency signal $T_{13}$ 1st is maintained high. After the inactivation of the latency signal $T_{13}$ 1st, the third address transition detection signal ATD depends on the detector 10 and the pulse generator 24. In particular, when one of the address bit signals ADD1 to ADD3 transitions, an output A of the detector IO goes high, and then the pulse generator 24 generates its output B of an active low pulse form. So, the third address transition detection signal ATD is activated in an active low pulse form. As a result, the signal ATD is pulsed at each start of second and third sensing periods of the data sensing operation.

Figure 7:
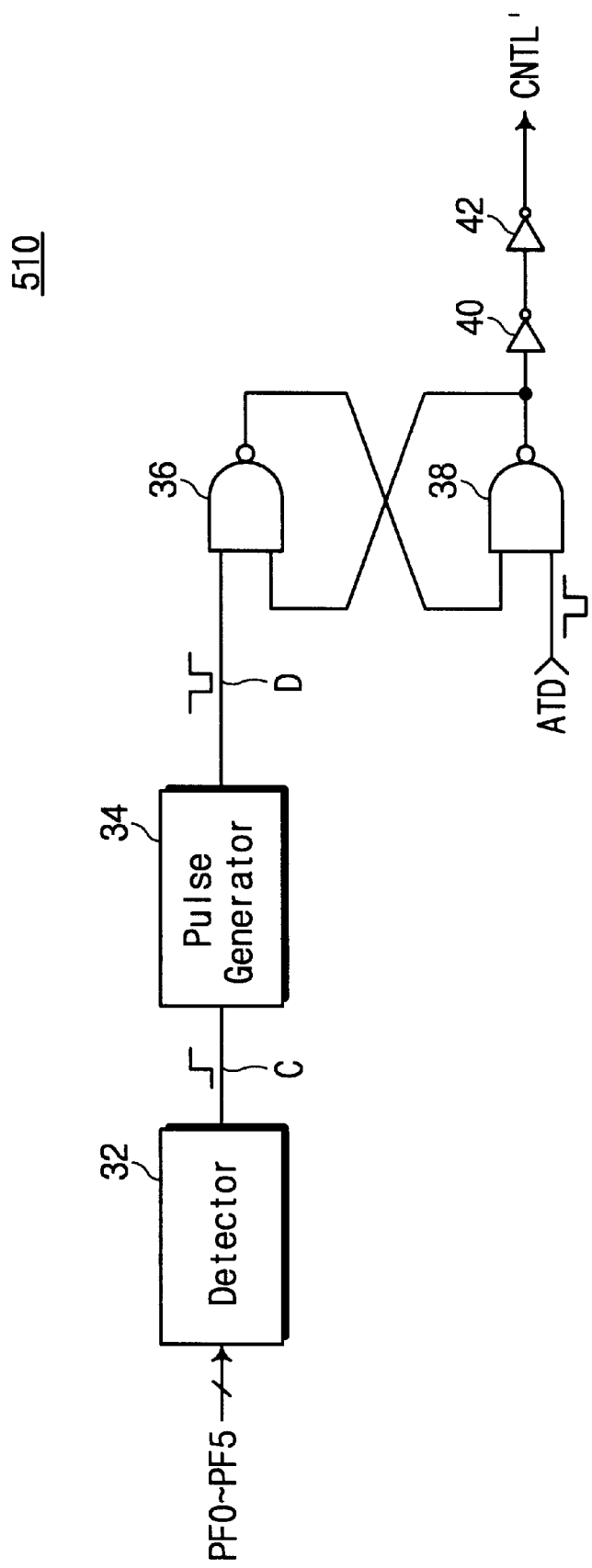
FIG. 7 is a preferred embodiment of a second clock controller in FIG. 5.

Referring again to FIG. 5, the second clock controller 510 generate a second clock control signal CNTL' to be provided into the oscillator 441 in response to the clock signals PF0 to PF2 and the third address transition detection signal ATD. A preferred embodiment of the second clock controller 510 is illustrated in FIG. 7. As shown in FIG. 7, a detector 32, a pulse generator 34, two NAND gates 36 and 38 cross-coupled with each other, and two inverters 40 and 42 constitute the second clock controller 510.

According to the second clock controller 510 of the present invention, the second clock control signal CNTL' is set at a logic high level when the third address transition detection signal ATD is low (during the activation of the latency signal T_1st). After the inactivation of the latency signal $T_{13}$ 1st, an output C of the detector 32 transitions from a logic low level to a logic high level when each sensing period is ended. The pulse generator 34 generates its output D of an active low pulse in response to the rising edge of the signal C from detector 32, so that the second clock control signal CNTL' is inactivated low and the oscillator 441 enters a hold state, not a disable state. This means that the clock signals PFi maintain their present states during the hold state. Therefore, a word line voltage level corresponding to the correct sensing period continues to be maintained during hold.

The signal CNTL' is reasserted when the third address transition detection signal ATD transitions from a logic high level a logic low level. This enables the oscillator 441 to enter to an enable state, so that the counter circuit 442 starts generating the clock signals PFi for the next sensing period.

When the first and second clock control signals CNTL and CNTL' are high, the clock generating section 440 enters an enable state so at to generate the clock signals PFi. When the first clock control signal CNTL is high and the second clock control signal CNTL' is low, the clock generating section 440 enters a hold state so at to hold the respective states of the clock signals PFi during the hold state. And, when the first clock control signal CNTL is low, the clock generating section 440 enters a disable state so at to inactivate the clock generating section 440. In accordance with the data sensing control scheme set forth above, it should be seen that each sensing period of the data sensing operation starts in synchronization with the read enable signal REb.

FIG. 8 is a timing diagram showing a burst mode access operation according to the second embodiment of the present invention. A burst mode access operation according to the second embodiment of the present invention will be described below with reference to the accompanying drawings. Assume that outputs from the address buffer circuit 140 are set low before external address input, that an address bit signal ADD4 of a logic low level is latched into the address buffer circuit 140, that when the signal ADD4 is low the left memory bank 110L is selected, and that when the signal ADD4 is high the right memory bank 110R is selected.

During first period t1, both the low and high address latch enable signals ALEL and ALEH go high, such that the low address bit signals are latched into the address buffer circuit 140. When the high address latch enable signal ALEH transitions from high to low, high address bit signals are latched into the address buffer circuit 140. Then, when the low address latch enable signal ALEL transitions from high to low, the address load signal ADLOAD is pulsed. This enables the Y-counters 230L and 230R and the counter 290 to latch corresponding address bit signals from the address buffer circuit 140. That is, the Y-counters 230L and 230R receives the second address bit signals A5 to A9 in response to the address load signal ADLOAD, and the counter 290 receives the first address bit signals A1 to A4 in response to ADLOAD.

During second period t2, the left and right memory banks 110L and 110R are read simultaneously as follows.

First, during the activation of the latency signal T_1st from the latency signal generator 470, the bank selection signal generator 480 generates first and second bank selection signals BNKS_L and BNKS_R, regardless of the address bit signal ADD4 state (this means that memory banks 110L and 110R are selected simultaneously). The sensing start signal generating section 420 produces the sensing start signal PSTART when the chip activation signal STB transitions from high to low. During t2, the sensing period detector 460 generates the sensing period detection signal SPDET in response to the sensing start signal PSTART, and the second clock controller 510 generates the second clock control signal CNTL' of a logic high level. At this time, the third address transition detection signal ATD remains low since the latency signal T_1st is high.

The first clock controller 430 generates the first clock control signal CNTL during the activation of the signal SPDET when the signal PSTART transitions from high to low. The clock generating section 440 generates the clocks signals PFi in response to the signals CNTL and CNTL', so that the sensing control signal generator 450 makes the sensing control signals PRE<0–2>, SEN<0–2> and DIS<0–2> sequentially in response to the clock signals PFi. The sensing period signal generator 490 produces the first, second and third sensing period signals STG1, STG2 and STG3 sequentially in accordance with the sensing control signals PRE<0–2>, SEN<0–2> and DIS<0–2>. As a result, the word line voltage control circuit 320 generates first and second word line voltages VPL and VPR in response to the signals STG1, STG2, STG3, BNKS_L and BNKS_R.

The word line voltages VPL and VPR are supplied to a row (word line) of the memory bank 110L and to the same row (word line) of the memory bank 110R. As the word line voltages VPL and VPR vary over the first, second and third sensing periods, 8-bit data corresponding to each group of the memory banks 110L and 110R is latched into the data registers 260L and 260R through the Y-pass gate circuits 240L and 240R and the sense amplifier circuits 250L and 25OR. The sensing period detector 460 inactivates the sensing period detection signal SPDET when the data sensing operation is ended. The signal ATD goes high when the latency signal T_1st transitions from high to low, and the clock controller 430 inactivates the clock control signal CNTL, disabling the clock generating section 440. This completes the data sensing operation for the memory banks 110L and 110R.

During third period t3, under the control of signals ADD3, LSC0, LSC1, LSC2 and LSC3, data held in data register 260L is sequentially output, in synchronization with the read enable signal Reb, to the exterior through the 10 buffer circuit 330. The left register is output first because the address bit signal ADD4 used for bank selection is low. At the same time, the data register 260R continues to hold data sensed during the period t2.

As illustrated in FIG. 8, when the address bit signal ADD4 transitions from low to high (meaning that the right memory bank 110R is selected), data in the data register 260R is sequentially transferred in synchronization with the read enable signal Reb, to the exterior through the 10 buffer circuit 330, during period t4. At the same time, a data sensing operation for the left memory bank 110L is performed as follows.

When the address bit signal ADD4 transitions from low to high, the first address transition detecting section 410 generates the first address transition detection signal YCNTL in a pulse form, the bank selection signal generator 480 activates the bank selection signal BNKS_L (the latency signal T_1st is maintained low), and the Y-counter 230L performs its count-up operation. The sensing start signal generating section 420 generates the signal PSTART in response to the address transition detection signal YCNTL, so that the signals SPDET and CNTL' are activated high.

The clock controller 430 generates the first clock control signal CNTL during the activation of the signal SPDET, when the signal PSTART transitions from high to low. The clock generating section 440 generates the clock signals PFi in response to the control signals CNTL and CNTL', so that the sensing control signal generator 450 makes the sensing control signals PRE0, SEN0 and DIS0 sequentially in response to the clock signals PFi. The sensing period signal generator 490 produces the first sensing period signal STG1 in response to the sensing control signals PRE0, SEN0 and DIS0. As a result, the word line voltage control circuit 320 generates word line voltage VPL corresponding to the first sensing period in response to the signals STG1 and BNKS_L.

The word line voltage VPL is supplied to the selected row (word line) of the memory bank 110L, and a data sensing operation for the first sensing period is performed. The second clock controller 510 detects when the first sensing period has ended. At this time, the controller 510 inactivates the second clock control signal CNTL', placing clock generating section 440 into a hold state. Consequently, the word line voltage VPL level corresponding to the first sensing period is also held.

The second clock controller 510, reactivates the signal CNTL' in response to the detection signal ATD, which pulses when one of the address bit signals ADD1-ADD3 transitions in synchronization with the read enable signal REb. The clock generating section 440 reenters the enable state, where it once again generates the clock signals PFi in response to the control signal CNTL', and the sensing control signal generator 450 makes the sensing control signals PRE1, SEN1 and DIS1 sequentially in response to the clock signals PFi. The sensing period signal generator 490 produces the second sensing period signal STG2 in response to the sensing control signals PRE1, SEN1 and DIS1. As a result, the word line voltage control circuit 320 generates the word line voltage VPL corresponding to the second sensing period in response to the signals STG2 and BNKS_L.

The word line voltage VPL is supplied to the selected row (word line) of the memory bank 110L, and a data sensing operation for the second sensing period is performed. The second clock controller 510 detects when the second sensing period has ended. At this time, the controller 510 inactivates the second clock control signal CNTL', placing clock generating section 440 once again into a hold state. Consequently, the word line voltage VPL level corresponding to the second sensing period is also held.

The second clock controller 510, again reactivates the signal CNTL' in response to the detection signal ATD which pulses when one of the address bit signals ADD1-ADD3 transitions in synchronization with the read enable signal REb. The clock generating section 440 reenters the enable state, where it once again generates the clock signals PFi in response to the control signal CNTL', and the sensing control signal generator 450 makes the sensing control signals PRE2, SEN2 and DIS2 sequentially in response to the clock signals PFi. The sensing period signal generator 490 produces the third sensing period signal STG3 in response to the sensing control signals PRE2, SEN2 and DIS2. As a result, the word line voltage control circuit 320 generates the word line voltage VPL corresponding to the third sensing period in response to the signals STG3 and BNKS_L.

The word line voltage VPL is supplied to the selected row (word line) of the memory bank 110L, and a data sensing operation for the third sensing period is performed. The sensing period detector 460 when the data sensing operation of the first to third sensing periods has ended. At this time, detector 460 inactivates the sensing period detection signal SPDET, placing the clock generating section 440 in a disabled state. This completes the data sensing operation for the memory bank 110L during the data-out phase of the memory bank 110R. Similar burst mode access operation continues to be performed until all required data has been read out.

In accordance with the second preferred embodiment of the present invention, after the period t2(where the initial data sensing operation for the memory banks 110L and 110R is performed), the first sensing period for one memory bank starts by use of transition information of the address bit signal ADD4 (the signal ADD4 is used for bank selection and is generated in synchronized with the read enable signal). And the second and third sensing periods start by use of transition information from the address bit signals ADD1-ADD3 which are generated in synchronization with the read enable signal REb. Therefore, the power noise (or IO noise) issued at data-out does not affect the respective data sensing operations of each sensing period, so that the memory device 100 has immunity against the power noise. As a result, the memory device with the data sensing control scheme according to the second embodiment provides a stable data sensing operation, and has an improved reliability.

The invention has been described using exemplary preferred embodiments. It is to be understood, however, that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor memory device comprising:

a memory array having first and second memory banks, each bank comprising a plurality of memory cells for storing multi-level data;

a counter circuit for receiving externally applied address bit signals, generating an internal address based on the address bit signals, and incrementing the internal address in synchronization with a read enable clock signal;

a data sensing control circuit that generates a set of data sensing control signals and bank selection signaling, based on the internal address supplied by the counter circuit; and a data reading circuit operated responsive to the data sensing control signals, capable of sensing multi-level data from the first and second memory banks alternately, wherein the data reading circuit holds the multi-level data sensed from one of the memory banks and, at the same time, senses multi-level data from the other of the memory banks during a data sensing operation timed such that data sensing during a read enable clock signal transition is avoided.

2. The semiconductor memory device according to claim 1, wherein during the data sensing operation for one of the memory banks, the multi-level data held in the data reading circuit and corresponding to the other memory bank is output sequentially in synchronization with the read enable clock signal and in accordance with the internal address.

3. The semiconductor memory device according to claim 1, wherein the data sensing control circuit comprises:

an address transition detecting section for generating a first address transition detection signal (YCNTL) in a pulse form when one address bit signal of the internal address transitions from a first logic level to a second logic level, and for generating a second address transition detection signal (YCNTR) in a pulse form when the one address bit signal transitions from the second logic level to the first logic level;

a sensing start signal generating section for generating a sensing start signal (PSTART) in a pulse form when the first address transition detection signal, the second address transition detection signal, or a chip activation signal transitions to a given logic level;

a clock generating section for generating a plurality of clock signals in response to a clock control signal, wherein each of the clock signals has a different period than the others;

a sensing control signal generator for generating the data sensing control signals in response to the clock signals during the data sensing operation;

a sensing period detector for activating a sensing period detection signal indicating the period of the data sensing operation in response to the sensing start signal, wherein the sensing period detector receives the clock signals, detects when the data sensing operation has ended, and inactivates the sensing period detection signal in accordance with the detection result; and a clock controller responsive to the sensing start signal, for activating the clock control signal during the activation of the sensing period detection signal so as to generate the clock signals, wherein the clock controller inactivates the clock generating section upon inactivation of the sensing period detection signal.

4. The semiconductor memory device according to claim 1, wherein the data sensing operation is comprised of first, second and third sensing periods, each of which is divided into a set of bit line precharge, data sensing and bit line discharge operations.

5. The semiconductor memory device according to claim 4, wherein the data sensing control circuit comprises:

a latency signal generator for generating a latency signal in response to a chip activation signal, wherein the latency signal generator inactivates the latency signal when the read enable clock signal is toggled;

a first address transition detecting section for generating a first address transition detection signal (YCNTL) in a pulse form when one address bit signal of the internal address transitions from a first logic level to a second logic level, and for generating a second address transition detection signal (YCNTR) in a pulse form when the one address bit signal transitions from the second logic level to the first logic level;

a second address transition detecting section for generating a third address transition detection signal when at least one other address bit signal of the internal address transitions after the inactivation of the latency signal;

a sensing start signal generating section for generating a sensing start signal (PSTART) in a pulse when the first address transition detection signal, the second address transition detection signal, or the chip activation signal transitions to a given logic level;

a clock generating section for generating a plurality of clock signals in response to first and second clock control signals, wherein each of the clock signals has a different period than the others;

a sensing control signal generator for generating the data sensing control signals in response to the clock signals during the data sensing operation;

a sensing period detector for generating a sensing period detection signal indicating a period of the data sensing operation in response to the sensing start signal, wherein the sensing period detector receives the clock signals, detects when the data sensing operation has ended, and inactivates the sensing period detection signal in accordance with the detection result;

a first clock controller responsive to the sensing start signal, for generating the first clock control signal during the activation of the sensing period detection signal and inactivating the clock generating section at the inactivation of the sensing period detection signal; and a second clock controller for generating the second clock control signal in response to the clock signals and the third address transition detection signal, wherein the second clock controller detects an end point of each sensing period and inactivates the second clock control signal, thereby holding the clock signals, and wherein the second clock controller activates the second clock control signal in response to the third address transition detection signal, thereby causing the clock generating section to resume generating the clock signals.

6. The semiconductor memory device according to claim 5, wherein the data sensing control circuit further comprises:

a sensing period signal generator for generating first, second and third sensing period signals, corresponding respectively to the first to third data sensing periods, in response to the sensing control signals; and a bank selection signal generator for generating first and second bank selection signals in response to the one address bit signal and the latency signal, wherein the bank selection signal generator activates both of the first and second bank selection signals during the activation of the latency signal and activates one of the bank selection signals in accordance with the one address bit signal during the inactivation of the latency signal.

7. The semiconductor memory device according to claim 6, wherein the data reading circuit is comprised of first and second data reading sections corresponding respectively to the first and second memory banks, wherein each of the data reading sections comprises:

a second counter circuit for receiving a second plurality of address bit signals, generating a second internal address based on the second plurality of address bit signals, and incrementing the second internal address, in synchronization with the read enable clock signal, when a corresponding one of the first and second address transition detection signals is pulsed;

a column selecting section for selecting at least one of column of the corresponding memory bank, based on the second internal address;

a sense amplifier circuit for sensing multi-level data from a corresponding memory bank in response to the sensing control signals; and a data register for latching sensed multi-level data from the sense amplifier circuit for output in accordance with the internal address supplied by the first counter circuit.

8. A semiconductor memory device comprising:

a memory array having first and second memory banks, each bank comprising a plurality of memory cells, the memory array having a burst access mode wherein data from one memory bank is output while data from the other memory bank is sensed; and a data sensing control circuit for generating data sensing control signals for the memory array, the data sensing control signals synchronized to a read enable clock signal during burst access mode operation, such that a data-sensing operation occurs between two successive read enable clock signals.

9. The memory device of claim 8, wherein each memory cell stores multi-level data and requires multiple sensing periods, each comprising a data-sensing operation, in order to sense the multi-level data in a cell, and wherein the data sensing control circuit generates data sensing control signals for the multiple sensing periods such that the data-sensing operation of each sensing period occurs between two successive read enable clock signals.

10. A method of operating a memory device comprising memory cells for storing multi-level data, the method comprising the steps of:

reading a plurality of data values stored in the memory device into an output buffer in parallel;

outputting the plurality of data values serially from the output buffer in response to consecutive read enable clock signals; and, during the outputting step, sensing a second plurality of data values stored in the memory device, wherein the sensing step is synchronized with the read enable clock signals, thereby avoiding data sensing during a read enable clock signal transition.

11. The method of claim 10, wherein the sensing step requires multiple sensing periods in order to sense multi-level data stored in a memory cell, and wherein each sensing period is synchronized to occur between two successive read enable clock signals.

12. The method of claim 11, wherein the memory device comprises first and second memory banks, and wherein the sensing step is performed on memory cells in one memory bank while the outputting step is outputting data values from the other memory bank.

13. The method of claim 11, wherein each memory bank has its own output buffer, further comprising the step of sensing data values from both memory banks into their corresponding output buffers at the beginning of a burst access of multiple data values.

* * * * *

UNITED STATES PATENT AND TRADEMARK OFFICE
CERTIFICATE OF CORRECTION

PATENT NO. : 6,324,115 B1
DATED : November 27, 2001
INVENTOR(S) : Choi

It is certified that error appears in the above-identified patent and that said Letters Patent is hereby corrected as shown below:

<u>Column 4,</u>
Line 62, "two bit" should read -- two bits --.

<u>Column 5,</u>
Line 4, "210 X-pre" should read -- 210 and X-pre --.
Line 32, "Reb" should read -- Reb --.

<u>Column 6,</u>
Line 58, "STG3" should read -- STG2 --.

<u>Column 9,</u>
Line 41, "T131st" should read -- T_1st --.

<u>Column 10,</u>
Lines 53 and 55, "T131st" should read -- T_1st --.
Line 58, "detector I0" should read -- detector 10 --.

<u>Column 11,</u>
Line 12, "T131st" should read -- T_1st --.
Line 25, "high level a logic" should read -- high level to a logic --.
Lines 31, 34 and 37, "so at to" should read -- so as to --.

UNITED STATES PATENT AND TRADEMARK OFFICE
CERTIFICATE OF CORRECTION

PATENT NO. : 6,324,115 B1
DATED : November 27, 2001
INVENTOR(S) : Choi

It is certified that error appears in the above-identified patent and that said Letters Patent is hereby corrected as shown below:

<u>Column 12,</u>
Line 53, "10 buffer" should read -- IO buffer --.
Line 62, "Reb" should read -- Reb --.
Line 62 "10 buffer" should read -- IO buffer --.

<u>Column 14,</u>
Line 24, "in synchronized" should read -- in synchronization --.

Signed and Sealed this

Fifteenth Day of October, 2002

*Attest:*

*Attesting Officer*

JAMES E. ROGAN
*Director of the United States Patent and Trademark Office*